United States Patent [19]

Mine et al.

[11] Patent Number: 4,640,005

[45] Date of Patent: Feb. 3, 1987

[54] SUPERCONDUCTING MAGNET AND METHOD OF MANUFACTURE THEREOF

[75] Inventors: Susumu Mine, Zushi; Takao Ishizaka, Sagamihara, both of Japan

[73] Assignee: Tokyo Shibaura Denki Kabushiki Kaisha, Kawasaki, Japan

[21] Appl. No.: 619,894

[22] Filed: Jun. 12, 1984

Related U.S. Application Data

[62] Division of Ser. No. 363,888, Mar. 31, 1982, Pat. No. 4,549,156.

[30] Foreign Application Priority Data

Oct. 8, 1981 [JP] Japan .............................. 56-160523
Dec. 4, 1981 [JP] Japan .............................. 56-194430

[51] Int. Cl.⁴ .............................................. H01L 39/24
[52] U.S. Cl. ...................................... 29/599; 335/216; 29/605; 29/602 R
[58] Field of Search .................... 335/216; 174/126 S, 174/128 S; 29/599, 605, 602 R, 598

[56] References Cited

U.S. PATENT DOCUMENTS 3,356,976 12/1967 Sampson et al. .................... 335/216
3,619,479 11/1971 Bogner ............................... 335/216
4,462,152 7/1984 Okamoto et al. ...................... 29/598

*Primary Examiner*—Howard N. Goldberg
*Assistant Examiner*—Vernon K. Rising
*Attorney, Agent, or Firm*—Oblon, Fisher, Spivak, McClelland, & Maier

[57] ABSTRACT

A superconducting magnet, applied for a train side permanent magnet for a magnetically levitated train as one embodiment of the invention, comprises a coil structure including a superconducting wire wound into a form of a race track and impregnated with epoxy resin, an annular vessel member accommodating the coil structure, and a spacing member rigidly mounted in the vessel member so as to divide the interior thereof into first and second spaces. The coil structure is securely sealed in the first space, and the second space constitutes a liquid helium path.

14 Claims, 7 Drawing Figures

SUPERCONDUCTING MAGNET AND METHOD OF MANUFACTURE THEREOF

This is a division of application Ser. No. 363,888, filed Mar. 31, 1982, now U.S. Pat. No. 4,549,156.

BACKGROUND OF THE INVENTION

The present invention relates to a superconducting magnet and a method of manufacture thereof.

With the superconducting magnet of today, by holding a coil structure including a superconducting wire to be in the superconducting state, no potential difference is produced across the coil structure, and the electric resistance is substantially zero. Thus, once current is supplied to the coil structure, the coil structure can carry current continually for a very long period of time (this state being referred to as "permanent current state") even when the power source is subsequently disconnected. The density of current that can be passed through the superconducting coil, while maintaining the zero electric resistance state, is very high, about 100 times, compared to the case of the coil in the normal state.

The superconducting magnet having the above property finds very extensive applications; for example it is used as a nuclear fusion plasma shut-off electromagnet, a high energy particle acceleration electromagnet, a train side permanent magnet for a magnetically levitated train, a generator rotor electromagnet, etc.

In the superconducting magnet of prior art, for instance a superconducting magnet for magnetically levitated train, the superconducting coil is race track shaped and has a rectangular sectional profile. It is impregnated with a hardenable material such as an epoxy resin and is accommodated in a vessel member. The vessel member is also race track shaped and isolates the coil from atmospheric conditions. Inside the vessel member, the superconducting coil is supported at discontinuous points by a plurality of spacers. The annular inner space of the vessel member is partitioned by a plurality of spacer plates into a plurality of chambers. The spacer plates are each provided with openings. Coolant such as liquid helium is caused to pass through the chambers by clearing the openings. The superconducting coil structure is thus held cooled to be lower than the transition temperature thereof.

However, with the prior art superconducting magnet as described above, in which the coil structure is directly and discontinuously supported by the spacer plates (over narrow support areas corresponding to the thickness of the spacer plates), the mechanical strength of the support with respect to electromagnetic force is insufficient. Particularly, with the superconducting magnet for magnetically levitated train where strong vibrations are experienced, rattling or looseness is liable to result between the coil structure and spacer plates, and this leads to a hazard of instable securement of the coil. Further, since the superconducting coil is supported at its four sides over a narrow area corresponding to the thickness of the spacer plate, heat of friction is liable to be generated in the coil support regions due to electromagnetic forces. If the heat of friction is generated, the coil is locally heated to result in an undesired result of its state change from the superconducting state to the normal state (this phenomenon being referred to as "coil quench").

Further, when manufacturing the aforementioned prior art superconducting magnet, it is necessary to mount a plurality of spacer plates on the coil and fix them to the vessel member. Therefore, the productivity in manufacture is inferior, causing manufacturing cost of the superconducting magnet to become high. Further, in the prior art manufacture of the superconducting magnet, the superconducting coil has to be impregnated with the hardenable material such as epoxy resin before setting it in the vessel member. Therefore, the possibility of inflicting adverse effects such as cracks on the impregnated coil structure, due to heat in welding at the time of the assembly, is high. As a result, the property of the coil structure is undesirably caused to deteriorate. Thus, there has been established no satisfactory results in connection with the superconducting magnet and method of manufacture thereof.

SUMMARY OF THE INVENTION

An object of the present invention is to provide a superconducting magnet and method of manufacture thereof, with which it is possible to stably set the superconducting coil structure in a vessel member and reliably prevent the state change of the coil structure from the superconducting state to the normal state as well as improving the efficiency of manufacture.

With the superconducting magnet according to the present invention, a coil body formed of a superconducting wire wound a predetermined number of turns into a closed loop form and impregnated with a hardenable material is accommodated in an annular vessel member. The vessel member isolates the coil body from the atmospheric conditions. A coil supporting member is provided inside the vessel member. The coil supporting member is rigidly provided inside the vessel member such that it extends annularly through the interior space of the vessel to divide the interior space into first and second annular spaces which are hermetically sealed independent. The coil body is sealed in the first annular space in the vessel member and supported by the surfaces defining this space in area contact with the surfaces, whereby the coil body is stably secured in the vessel member. The second annular space in the vessel member serves as a coolant path.

DETAILED DESCRIPTION OF THE PREFERRED EMBODIMENTS

Figure 1:
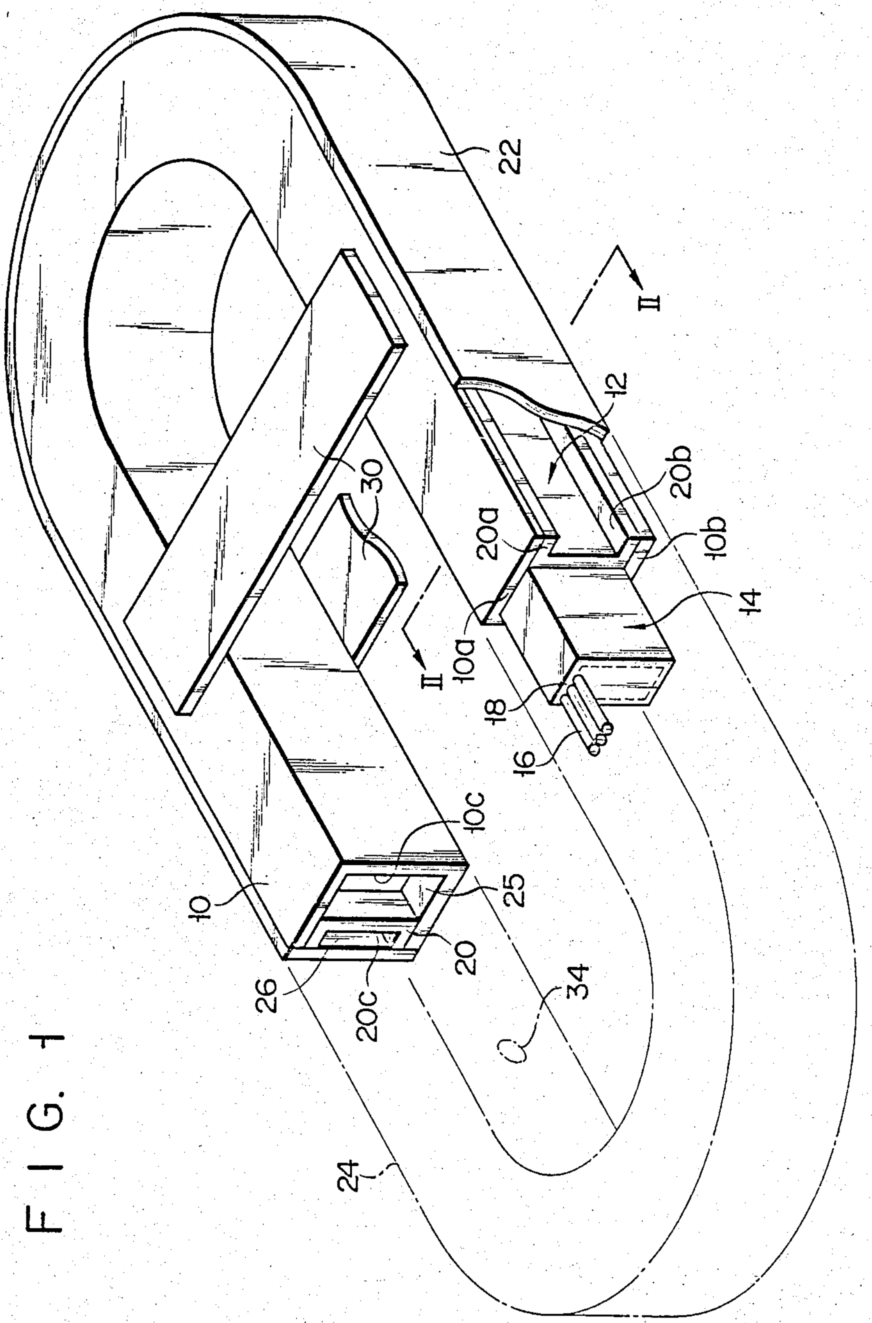
FIG. 1 is a perspective view, partly broken away and depicted by imaginary lines, showing one embodiment of the superconducting magnet according to the present invention.
Figure 2:
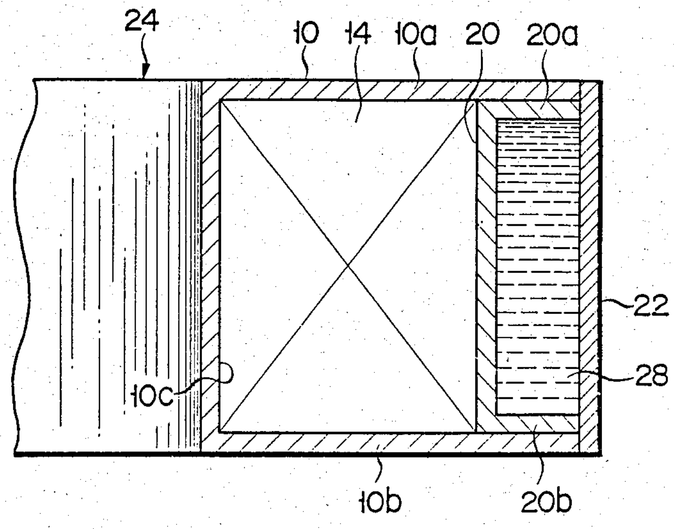
FIG. 2 is a sectional view of the superconducting magnet and is taken along line II—II of FIG. 1.

Referring now to FIGS. 1 and 2, there is illustrated therein one form of a superconducting magnet of the type utilized as a train side permanent magnet for a magnetically levitated train according to the present invention. A winding former 10, which is made of a non-magnetic metal such as stainless steel, is closed loop shaped, for instance race track shaped. This winding former 10 is rectangular channel shaped in section, and has an outer open side 12. In detail, the winding former 10 has guide plates 10*a* and 10*b* which extend, substantially in a perpendicular direction, from both ends of a plate portion 10*c*. The guide plates 10*a* and 10*b* are integral with the plate portion 10*c*. A superconducting coil structure 14 is formed within this race track shaped winding former 10 by being guided by guide edges 10*a* and 10*b* thereof. The coil structure 14 as a whole is also race track shaped, and it has a rectangular sectional profile.

The superconducting coil structure 14 includes a wire 16 of a superconducting material, for instance Nb-Ti. The superconducting wire 16 is first closely wound a predetermined number of turns, for instance 1,000 turns, in contact with the bottom 10*c* of the winding former 10. Thus, the coil structure 14 obtaining by winding the superconducting wire 16 has a rectangular sectional profile corresponding to the sectional profile of the winding former 10. The coil structure 14 is then impregnated with a given hardenable material, for instance an epoxy resin 18. Consequently, the coil structure 14 is made rigid as a whole and is immovably sealed in a first one of race track shaped inner spaces defined by the winding former 10 and spacing member 20. More particularly, the coil structure 14 is held in close contact with and secured to the surfaces of the winding former 10 and metal spacing member 20 that define the first space mentioned above. In FIG. 1, the epoxy resin layer 18 impregnating the superconducting wire 16 of the coil structure 14 is shown with exaggerated thickness so that it can be readily distinguished from the wire 16. Actually, however, the epoxy resin 18 does not form a thick layer as is illustrated for it is impregnated into the superconducting wire structure 16.

The spacing member 20 is closed loop shaped similar to the race track shape of the winding former 10, and also has a channel-like sectional profile (like one of square brackets). The outer surfaces of edge portions 20*a* and 20*b*, perpendicularly extending from the opposite edges of a plate portion 20*c* of the spacing member 20, are in close contact with the inner surfaces of the guide edges 10*a* and 10*b* of the winding former 10. The spacing member 20 may be secured to the winding former 10 by means of welding. An outer cover member 22 is secured by means of welding to the outer open side 12 of the winding former 10 with the spacing member 20 mounted therein. Then, a vessel 24 is formed by the winding former 10 and outer cover member 22. The interior of the vessel 24 is divided by the spacing member 20 into two spaces. These two spaces are race track shaped and independently hermetical. One of the spaces, i.e., space 25, is the aforementioned first space in which the superconducting coil structure 14 is accommodated and secured. The other space or second space 26 serves as a coolant path. As shown in FIG. 2, the second space 26 is filled with a coolant, for instance liquid helium 28.

As shown in FIG. 1, metal plates 30 are secured by means of welding to the superconducting magnet vessel 24. If the race track shaped superconducting magnet is excited up, the electromagnetic force present in the straight portions of the race track shaped vessel 24 becomes large. Under such circumstances, the metal plates 30 serve as reinforcing plates for preventing outward swelling of the straight portions of the vessel 24 due to the electromagnetic force as mentioned above. While in FIG. 1, only a single pair of reinforcing plates are shown mounted on the upper and lower outer surfaces of the vessel 24, but actually, a total of 5 pairs of such plates are provided in this embodiment, for example.

With the superconducting magnet having the construction described above embodying this invention, the superconducting coil structure 14 having a rectangular sectional profile is supported in continuous face-contact with the inner surfaces of the winding former 10 and one surface of the spacing member 20. Thus, the coil structure 14 is secured inside the vessel 24 more firmly compared to the prior art, so that mechanical vibrations externally exerted to the coil structure 14 can be sufficiently and steadily withstood. Further, since the coil structure 14 is accommodated in the first space 25, defined by the winding former 10 and spacing member 20, in continuous face-contact with the surfaces defining this space, friction due to electromagnetic forces can be reduced, so that it is possible to reliably eliminate the coil quench.

Further, since the spacing member 20 has a simple form compared to the prior art, the assembling step at the time of the manufacture can be simplified, and also the spacing member 20 can be precisely welded to the winding former 10. Further, where outward force is generated by the electromagnetic force, thickness of the member 20 can be reduced for the coil 14 is supported by the entire surface of the spacing member 20. Thus, it is possible to reduce the total weight of the superconducting magnet. The fact that it is possible to provide a light weight superconducting magnet is very useful particularly for use as the train side permanent magnet for a magnetically levitated train.

Now, the method for manufacturing the superconducting magnet shown in FIGS. 1 and 2 will be described. It will be understood that, with the construction as described above, very useful effects as will be described below can be obtained regarding the method of manufacture.

When manufacturing the superconducting magnet as described above, the superconducting wire 16 is first wound on the plate portion 10*c* of the winding former 10 and also by being guided by the guide edges 10*a* and 10*b*. The wire 16 is densely wound such that the individual turns are in close contact with one another. The winding thus obtained inside the winding former 10 has a rectangular sectional profile. Subsequently, the spacing member 20 is mounted in the winding former 10. The outer surfaces of the edge portions 20*a* and 20*b* of the member 20 are firmly welded to the guide plates 10*a* and 10*b* of the winding former 10, respectively. Thus, the winding of the superconducting coil 16 is sealed in the first space 25 defined by the winding former 10 and spacing member 20. The outer open side 12 of the winding former 10 is sealed by welding the outer cover member 22 to the guide plates 10*a* and 10*b*. The second space, i.e., coolant path 26, is thus formed. The vessel 24 is thus completed, and subsequently a hardenable material such as an epoxy resin is poured into the first space 25, formed by the welding former 10 and spacing member 20, through an injection port 34 which is provided in the plate portion of the welding former 10 constituting the vessel 24. The winding of the superconducting coil 16 is thus impregnated with the hardenable material to obtain the coil structure 14. When the epoxy resin is injected, air in the first space is exhausted through an exhaust port (not shown). Thus, the epoxy resin can be injected to entirely fill the first space 25, and the impregnation of the superconducting wire 16 can be done more effectively. In this way, the impregnated superconducting coil structure 14 is obtained in a form rigidly accommodated in the first space 25 of the vessel 24. After this impregnation step, the injection port 34 and exhaust port are closed by a well-known method.

As has been shown, with the method for manufacturing the superconducting magnet according to the present invention, the impregnation of the superconducting coil structure 14 with the hardenable material is carried out only after the assembly and welding of various parts are ended. Thus, there is no possibility, for the hardenable material such as epoxy resin 18 of the coil structure 14, to be adversely affected by the heat of welding or the like, so that the coil structure 14 is prevented from generating cracks. This means that the properties of the coil structure 14 can be maintained without deterioration during the manufacture. The spacing member can be easily assembled, and the welding can be promptly performed without worrying about the welding heat, welding distortion and the like, whereby it is possible to simplify the manufacture and curtail the time required for the manufacture.

Now, another embodiment of the superconducting magnet according to this invention will be described with reference to FIGS. 3 and 4. Corresponding parts to those in the preceding embodiment of FIGS. 1 and 2 are designated by like reference numerals or symbols, and their description is omitted. A metal plate 40 is disposed in a race track shaped winding former 10. The opposite edges of the metal plate 40 are welded to and in tightly contact with guide plates 10*a* and 10*b* of the winding former 10. A second space as a coolant path 42 is defined by the metal plate 40 and winding former 10. The metal plate 40 is supported at a predetermined distance from the inner surface of the side plate portion 10*c* of the winding former 10, opposite the outer open side 12, by two supports 44 and 46.

The superconducting coil structure 14 is accommodated in a first space 47, having the outer open side 12, defined by the winding former 10 and spacing plate 40. The coil structure 14 is in face-contact with the inner surfaces defining the first space 47. An outer cover member 22 is secured by means of welding to the guide plates 10*a* and 10*b* of the winding former 10. The vessel 24 is completed in this way, and the superconducting coil 14 is sealed in the first space 47. In this embodiment, the positional relation between the first space 47 accommodating the coil structure 14 and the second space 42 serving as the coolant path in the vessel 24 is converse to that in the preceding embodiment, and the coil structure 14 is in face-contact with the inner surface of the outer cover member 22 of the vessel 24. In this construction, the coolant 28 (FIG. 2) such as liquid helium filling the coolant path 42 flows along the plate portion 10*c* of the winding former 10 of the vessel 24 in contact with the plate portion 10*c* and spacing plate 40.

With the embodiment having the construction as described above, the same effects as described earlier in connection with the preceding embodiment of FIGS. 1 and 2 can be obtained. Further according to the present embodiment, the superconducting coil structure 14 extends in the form of a race track through an outer portion of the inner space of the vessel 24. Thus, the electromagnetic force of the superconducting magnet can be effectively provided to the outside. Particularly, where the superconducting magnet of the above construction is used as a train side permanent magnet for a magnetically levitated train, it is possible to increase the levitating force on the train. This is so because the superconducting magnet can be mounted closer to a ground side magnet (not shown) to enhance in effect the electromagnetic forces of repulsion.

Figure 4:
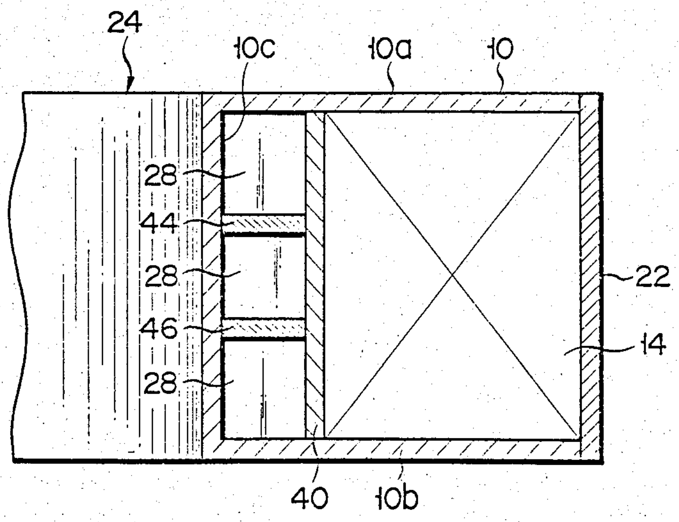
FIG. 4 is a sectional view, taken along line IV—IV, of the superconducting magnet shown in FIG. 2.
Figure 3:
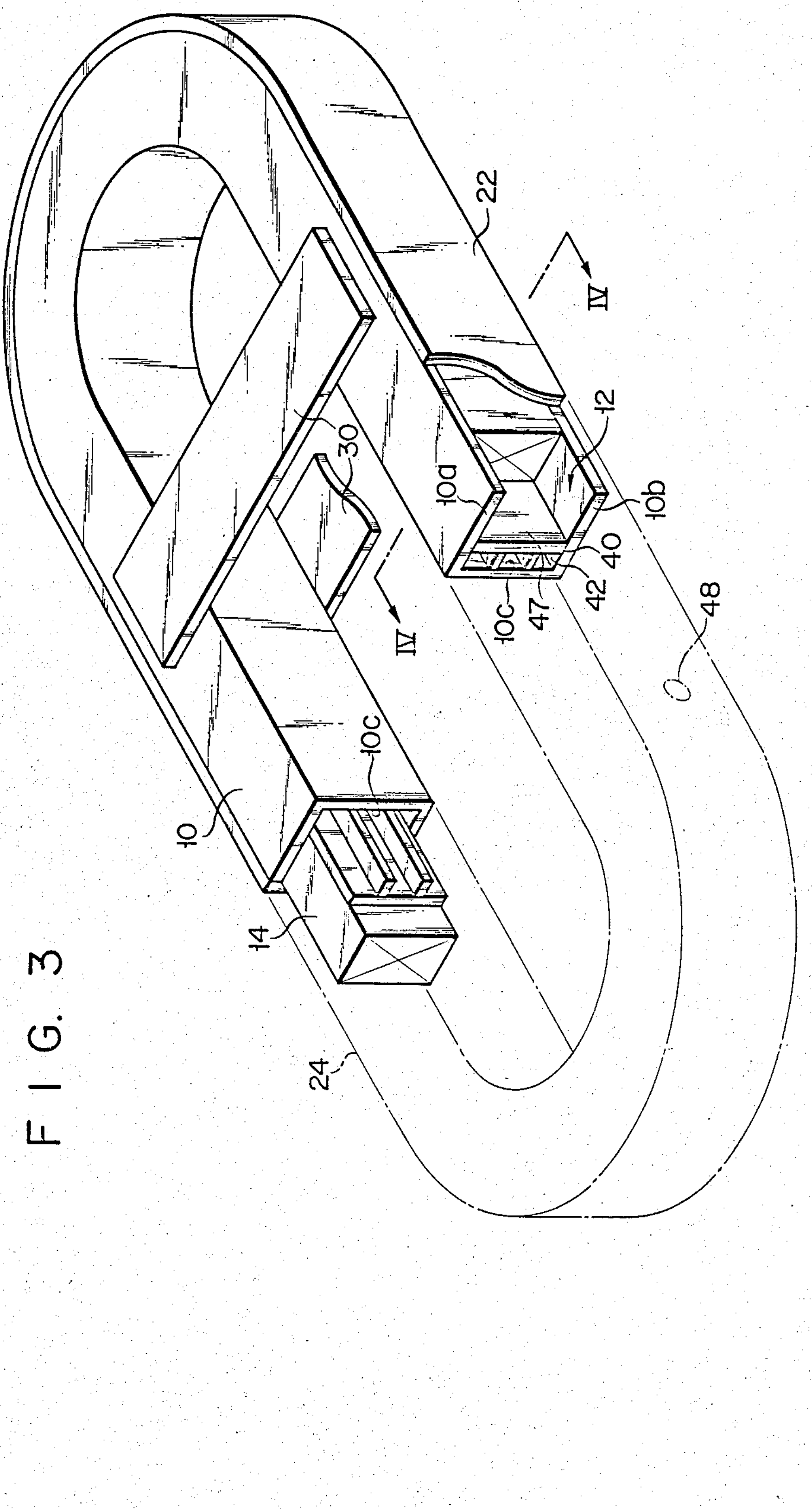
FIG. 3 is a perspective view, partly broken away and depicted in imaginary lines, showing another embodiment of the superconducting magnet according to this invention.

When manufacturing the superconducting magnet shown in FIGS. 3 and 4, the spacing plate 40 and supports 44 and 46 are first secured by means of welding to the inner side of the winding former 10. Then, the superconducting wire 16 (FIG. 1) is wound around the spacing plate 40 while being guided by the guide plates 10*a* and 10*b* of the winding former 10. The outer cover member 22 is then secured by welding to the winding former 10. The vessel 24 is completed in this way, and the coil structure 14 is rigidly sealed in the first space 47 in the vessel 24. Subsequently, a hardenable material is poured through an injection port 48 provided on the outer cover member 22 as shown in FIG. 3. The coil wire 16 is impregnated with this hardenable material to obtain the superconducting coil structure 14. Thus, the coil structure 14 can be prevented from being adversely effected by the heat of welding, welding distortion of the like, and deterioration of the coil characteristic can be reliably prevented. Further, like the previous embodiment, the manufacture is simplified and the manufacturing period can be curtailed. In place of directly winding the superconducting wire 16 on the winding former 10 in the above method of manufacture, it is also possible to wind a wire using a pattern (not shown) so as to obtain a winding which can fit the winding former 10 and then accommodate this winding round the spacing plate 40. In this case, the supports 44 and 46 may be omitted for the spacing plate 40 will not experience any force for winding the wire 16.

Figure 5:
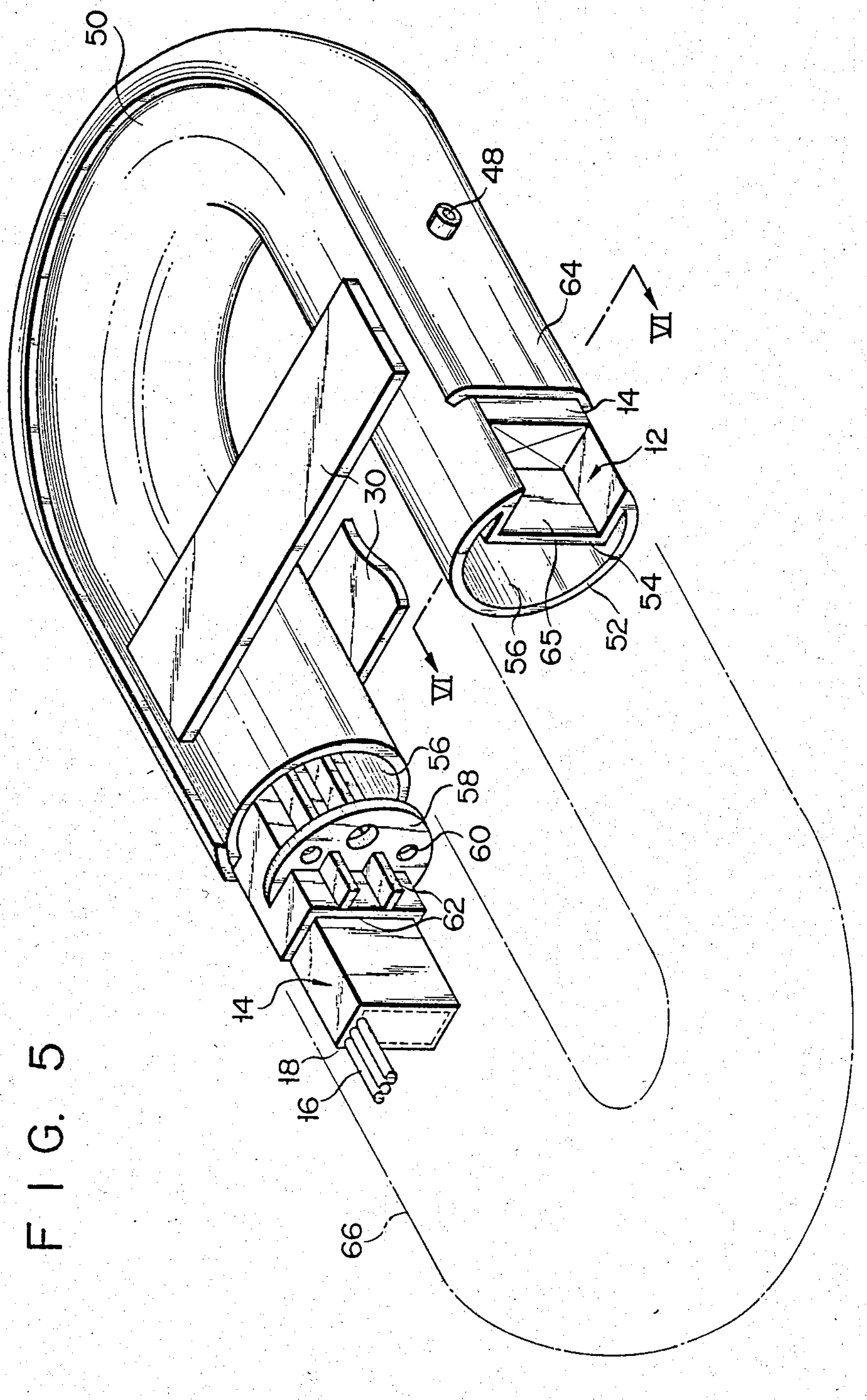
FIG. 5 is a perspective view, partly broken away and depicted by imaginary lines, showing a yet another embodiment of the superconducting magnet according to this invention.
Figure 6:
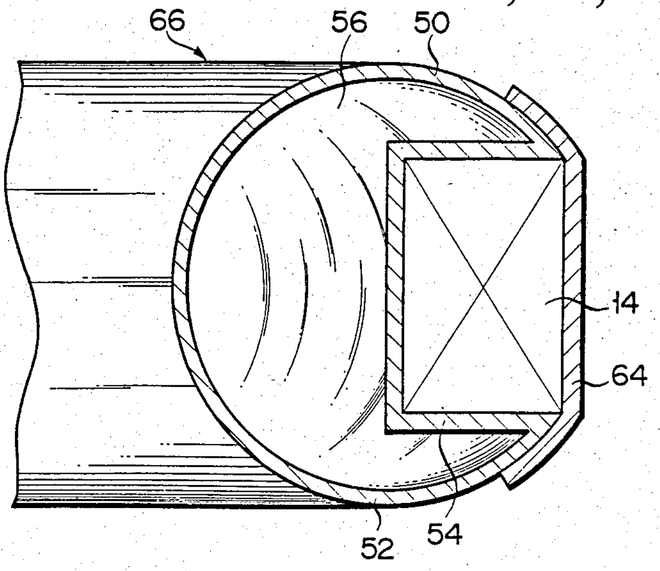
FIG. 6 is a sectional view of the superconducting magnet illustrated in FIG. 5 and is taken along line VI—VI of FIG. 5.

FIGS. 5 and 6 show a further embodiment of the superconducting magnet according to the present invention. Referring to FIG. 5, a race track shaped winding former 50 has an arcuate sectional profile, more particularly a sectional profile resembling a letter C. In other words, the winding former 50, which is a hollow member of an arcuate profile, consists of a pipe member 52 of an arcuate profile open on the outer side and a member 54, having a rectangular channel-like sectional profile, integral with open edge portions of the pipe member 52. The sealed inner space 56 of the winding former 50, having the shape as described above, corresponds to a second space which serves as the coolant path. A plurality of metal plates 58 (only one such metal plate being made visible in FIG. 5), each having a shape corresponding to the section of the coolant path 56, are disposed in the path 56, whereby the path 56 is divided into a plurality of chambers by the metal plates 58. Each plate 58 is formed with holes 60. Through the holes 60, the coolant such as liquid helium which is not shown in FIGS. 5 and 6 flows through the path 56. Reinforcing ribs 62 are provided on the inner surface of the channel-like member 54 of the winding former 50.

The superconducting wire 16 is wound around the channel-like member 54 of the winding former 50. The wire 16 is impregnated with a hardenable material to obtain the superconducting coil structure 14. The outer open side 12 of the channel-like member 54 of the winding former 50 is closed by an outer cover member 64. A vessel 66 is, thus, constituted by the outer cover member 64 and winding former 50. The outer cover member 64 has a strip-like shape having a greater width than the width of the outer open side of the channel-like member 54 of the winding former 50, and its opposite edges are welded to the outer surface of the winding former 50. The outer cover member 64 and channel-like member 54 define the first space 65 in which the coil structure 14 is sealed. For the rest, the construction is the same as that of the previous embodiments and will not be described.

With the superconducting magnet having the construction described above, by virture of the difference in the sectional profile between the C-shaped pipe member 52 and channel-like member 54, the superconducting coil structure 14 is cooled at its three sides by liquid helium flowing through the cooling path 56. Thus, the efficiency of cooling the coil structure 14 can be further improved. Further, since the winding former 50 has a C-shaped sectional profile which is gently curved, it is tough and can be readily fabricated.

Further, again in the manufacture of the superconducting magnet of the above construction, the impregnation of the superconducting wire 16 is carried out after the welding of parts including the outer cover member 64 has been completed. More particularly, a hardenable material such as an epoxy resin is introduced into the vessel 66 through an injection port 48 provided on the outer cover member 64, while exhausting air in the space first space defined by the channel-like member 54 of the vessel 66 from an exhausting port (not shown). Thus, the wire structure 16 is impregnated with the hardenable material and immovably accommodated in the vessel 66. The method of manufacture can thus be greatly simplified, and also it is possible to prevent deterioration of the property of the coil 14 due to heat at the time of the welding, welding distortion or the like. It is thus possible to manufacture high quality superconducting magnets with high yield and high efficiency.

Although the present invention has been shown and described with respect to particular embodiments, nevertheless, various changes and modifications which are obvious to a person skilled in the art to which the invention pertains are deemed to lie within the spirit, scope and contemplation of the present invention. For example, while in either of the above embodiments, the vessel 24 or 66 was race track shaped, this shape is by no means limitative, and it is possible to adopt any other suitable shape as well such as a circular shape or a saddle-shaped closed loop.

Figure 7:
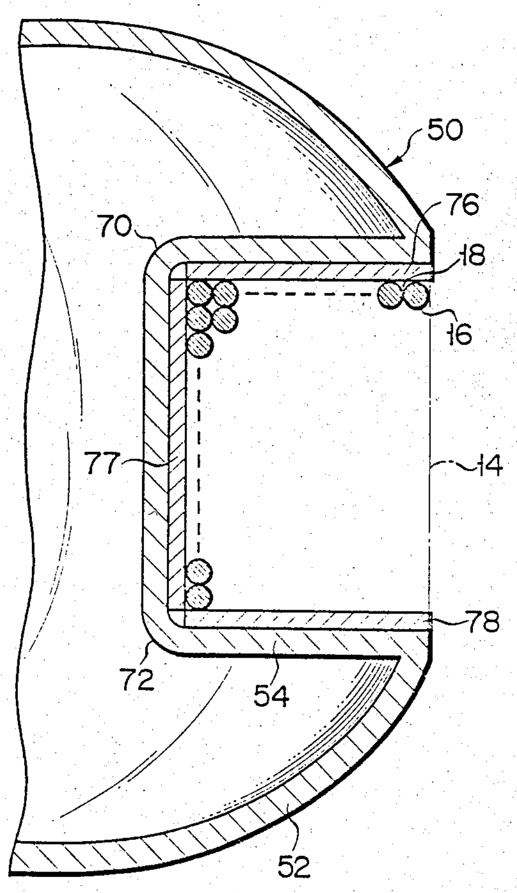
FIG. 7 is an enlarged-scale view showing an edge portion of the superconducting coil structure shown in FIG. 6.

Further, where the channel-like member 54 of the superconducting magnet shown in FIGS. 5 and 6 has round corners 70 and 72 as shown in FIG. 7, metal plates 76, 77 and 78 consisting of copper material or the like are bonded to the three inner surfaces of the channel-like member 54. According to such the arrangement, the superconducting wire 16 can be wound in accurate alignment even at the corners of the channel-like member 54. At the same time, the conductivity of the coil structure can be improved, since the metal plates have the good conductivity characteristics.

What we claim is:

1. A method of manufacturing a superconducting magnet, comprising:

a first step of providing a winding former having a bottom wall connected to opposed side walls to define a rectangular groove extending in a race track fashion and having an open side;

a second step of tightly winding a superconducting wire a predetermined number of turns within said rectangular groove of said winding former, to prepare a coil structure having a rectangular cross section conforming with the cross section of the bottom wall and at least a portion of the side walls of the groove;

a third step of hetmetically sealing the rectangular groove of the winding former filled with the coil structure within an annular space defined at least in part by said former to stably fix the coil structure so as to prevent generation of friction heat which causes the coil quench pheonmenon, i.e., change from the superconducting state to the normal state;

a fourth step of welding the components necessary for the vessel formation to the winding former; and a fifth step of injecting a hardenable material into the annular space having the coil structure disposed therein after the winding former heated in the welding step has been cooled to temperatures lower than a prescribed level so as to impregnate the coil structure with the hardenable material, whereby the coil structure impregnated with the hardenable material is prevented from cracking causing deterioration of properties such as reduction of magnetomotive force.

2. A method according to claim 1, wherein said third step comprises:

providing a bracket member having opposed side walls interconnected by means of a bottom wall to define a rectangular groove having an open side opposite said bottom wall, inserting said bracket member within said former with the bottom wall of said bracket member contacting and conforming with said coil structure, and sealingly connecting the side walls of said bracket member to the side walls of said former.

3. A method according to claim 2, wherein said fourth step comprises:

welding an outer cover member at least to the side walls of said bracket member at the outer side of said bracket member thereby to form a coolant space between said bracket member and said cover member.

4. A method of manufacturing a superconducting magnet, comprising:

a first step of providing a winding former having a bottom wall connected to opposed side walls to define a rectangular groove extending in a race track fashion and having an open side, said former further having a partition member welded to the opposed side walls a predetermined distance from said bottom wall to define a coolant space in the space between said bottom and side walls and said partition member;

a second step of tightly winding a superconducting wire a predetermined member of turns within a space between said side walls and said partition member of said former to prepare a coil structure having a rectangular cross section conforming with the cross section of said side walls and said separating plate;

a third step of welding an annular cover member to the side walls such that the opening of the winding former is hermetically sealed to form a sealed space, wherein the inner surface of the cover member is placed in continuous area-to-area contact with a residual surface of the coil structure exposed to the outside open side prior to welding; and a fourth step of injecting a hardenable material into the annular space between said cover, said side walls and said partition member having the coil structure disposed therein after the winding former heated during welding in the third step has been cooled to temperatures lower than a prescribed level so as to impregnate the coil structure with the hardenable material, whereby the coil structure impregnated with the hardenable material is prevented from cracking causing deterioration of properties such as reduction of magnetomotive force.

5. A method according to claim 4 wherein said second step comprises:

arranging the coil structure so as to be in continuous area-to-area contact with the opposed side walls and the partition member, thereby allowing a residual one surface of the coil structure to be exposed via the open side of the groove.

6. A method according to claim 4, wherein the fourth step includes injecting the hardenable material into said annular space through an injection port made in the annular cover member, and closing the injection port.

7. A method of manufacturing a superconducting magnet, comprising:

a first step of providing a winding former member including a hollow annular pipe member which has an open side of a predetermined width at a peripheral section thereof and which has a C-shaped sectional profile, and a groove defining member which defines a substantially rectangular channel-like groove defined by side walls coupled to the open side and a bottom wall connecting said side walls together, said winding former extending in a race track fashion, wherein a coolant space is defined in a space between said pipe and said groove defining member;

a second step of tightly winding a superconducting wire a predetermined number of turns within said rectangular groove extending in a race track fashion to prepare a coil structure having a rectangular cross section conforming with the cross section of the groove;

a third step of hermetically sealing the rectangular groove filled with the coil structure to stably fix the coil structure so as to prevent generation of friction heat which causes the coil quench phenomenon, i.e., change from the superconducting state to the normal state;

a fourth step of welding a cover to the side walls of said groove member;

a fifth step of injecting a hardenable material into an annular space of said rectangular groove between said cover and said groove member having the coil structure disposed therein after the winding former heated in the welding step has been cooled to temperatures lower than a prescribed level so as to impregnate the coil structure with the hardenable material, whereby the coil structure impregnated with the hardenable material is prevented from cracking causing deterioration of properties such as reduction of magnetomotive force.

8. The product produced by the process of claim 1.

9. The product produced by the process of claim 2.

10. The product produced by the process of claim 3.

11. The product produced by the process of claim 4.

12. The product produced by the process of claim 5.

13. The product produced by the process of claim 6.

14. The product produced by the process of claim 7.

* * * * *